(12) United States Patent
Lee et al.

(10) Patent No.: US 8,748,227 B2
(45) Date of Patent: *Jun. 10, 2014

(54) METHOD OF FABRICATING CHIP PACKAGE

(75) Inventors: Jin-Yuan Lee, Hsinchu (TW);
Ching-Cheng Huang, Hsinchu (TW);
Mou-Shiung Lin, Hsinchu (TW)

(73) Assignee: Megit Acquisition Corp., San Diego, CA (US)

( * ) Notice: Subject to any disclaimer, the term of this patent is extended or adjusted under 35 U.S.C. 154(b) by 66 days.

This patent is subject to a terminal disclaimer.

(21) Appl. No.: 12/206,754

(22) Filed: Sep. 9, 2008

(65) Prior Publication Data

US 2009/0011542 A1    Jan. 8, 2009

Related U.S. Application Data

(63) Continuation of application No. 09/821,546, filed on Mar. 30, 2001, now Pat. No. 7,498,196.

(51) Int. Cl.
*H01L 21/44* (2006.01)
*H01L 21/48* (2006.01)

(52) U.S. Cl.
USPC ............................ 438/108; 438/106; 438/614

(58) Field of Classification Search
USPC .......... 438/106, 108, 614; 257/678, 778, 781, 257/E21.503, E21.508, E21.511, E23.021, 257/738

See application file for complete search history.

(56) References Cited

U.S. PATENT DOCUMENTS

| 3,903,590 A | 9/1975 | Yokogawa |
| 4,606,962 A | 8/1986 | Reylek et al. |
| 4,840,923 A | 6/1989 | Flagello et al. |
| 4,866,501 A | 9/1989 | Shanefield |
| 5,081,563 A | 1/1992 | Feng et al. |

(Continued)

FOREIGN PATENT DOCUMENTS

| JP | 2000003985 A | 1/2000 |
| TW | 395000 | 6/2000 |

(Continued)

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

(Continued)

*Primary Examiner* — Hung Vu
(74) *Attorney, Agent, or Firm* — Seyfarth Shaw LLP

(57) ABSTRACT

A Chip Scale Package (CSP) and a method of forming the same are disclosed. Single chips without the conventional ball mountings, are first attached to an adhesive-substrate (adsubstrate) composite having openings that correspond to the input/output (I/O) pads on the single chips to form a composite chip package. Ball mounting is then performed over the openings, thus connecting the I/O pads at the chip sites to the next level of packaging directly. In another embodiment, the adhesive layer is formed on the wafer side first to form an adwafer, which is then die sawed in CSPs. Then the CSPs with the adhesive already on them are bonded to a substrate. The composite chip package may optionally be encapsulated with a molding material. The CSPs provide integrated and shorter chip connections especially suited for high frequency circuit applications, and can leverage the currently existing test infrastructure.

55 Claims, 10 Drawing Sheets

(56) References Cited

U.S. PATENT DOCUMENTS

| | | |
|---|---|---|
| 5,111,278 A | 5/1992 | Eichelberger |
| 5,148,265 A | 9/1992 | Khandros et al. |
| 5,148,266 A | 9/1992 | Khandros et al. |
| 5,196,377 A | 3/1993 | Wagner et al. |
| 5,241,456 A | 8/1993 | Marcinkiewicz et al. |
| 5,250,843 A | 10/1993 | Eichelberger |
| 5,258,330 A | 11/1993 | Khandros et al. |
| 5,281,151 A | 1/1994 | Arima et al. |
| 5,282,312 A | 2/1994 | DiStefano et al. |
| 5,291,066 A | 3/1994 | Neugebauer et al. |
| 5,300,812 A | 4/1994 | Lupinski et al. |
| 5,324,687 A | 6/1994 | Wojnarowski |
| 5,346,861 A | 9/1994 | Khandros et al. |
| 5,347,159 A | 9/1994 | Khandros et al. |
| 5,353,498 A | 10/1994 | Fillion |
| 5,366,906 A | 11/1994 | Wojnarowski et al. |
| 5,434,751 A | 7/1995 | Cole, Jr. et al. |
| 5,450,101 A | 9/1995 | Ishida et al. |
| 5,455,455 A | 10/1995 | Badehi |
| 5,480,835 A | 1/1996 | Carney et al. |
| 5,518,964 A | 5/1996 | DiStefano et al. |
| 5,524,339 A | 6/1996 | Gorowitz et al. |
| 5,541,442 A | 7/1996 | Keil et al. |
| 5,547,906 A | 8/1996 | Badehi |
| 5,548,091 A | 8/1996 | DiStefano et al. |
| 5,548,099 A | 8/1996 | Cole, Jr. et al. |
| 5,554,887 A | 9/1996 | Sawai et al. |
| 5,565,706 A | 10/1996 | Miura et al. |
| 5,570,504 A | 11/1996 | DiStefano et al. |
| 5,583,321 A | 12/1996 | DiStefano et al. |
| 5,640,761 A | 6/1997 | DiStefano et al. |
| 5,648,448 A | 7/1997 | Marrocco, III |
| 5,656,863 A | 8/1997 | Yasunaga et al. |
| 5,659,952 A | 8/1997 | Kovac et al. |
| 5,663,106 A | 9/1997 | Karavakis et al. |
| 5,679,977 A | 10/1997 | Khandros et al. |
| 5,682,061 A | 10/1997 | Khandros et al. |
| 5,685,885 A | 11/1997 | Khandros et al. |
| 5,688,716 A | 11/1997 | DiStefano et al. |
| 5,706,174 A | 1/1998 | Distefano et al. |
| 5,734,201 A | 3/1998 | Djennas et al. |
| 5,745,984 A | 5/1998 | Cole, Jr. et al. |
| 5,757,072 A | 5/1998 | Gorowitz et al. |
| 5,757,079 A | 5/1998 | McAllister et al. |
| 5,766,987 A | 6/1998 | Mitchell et al. |
| 5,776,796 A | 7/1998 | Distefano et al. |
| 5,777,379 A | 7/1998 | Karavakis et al. |
| 5,798,286 A | 8/1998 | Faraci et al. |
| 5,801,441 A | 9/1998 | DiStefano et al. |
| 5,810,609 A | 9/1998 | Faraci et al. |
| 5,812,378 A | 9/1998 | Fjelstad et al. |
| 5,821,608 A | 10/1998 | DiStefano et al. |
| 5,821,609 A | 10/1998 | DiStefano et al. |
| 5,830,782 A | 11/1998 | Smith et al. |
| 5,834,339 A | 11/1998 | Distefano et al. |
| 5,841,193 A | 11/1998 | Eichelberger |
| 5,846,875 A | 12/1998 | Haji |
| 5,847,936 A | 12/1998 | Forehand et al. |
| 5,848,467 A | 12/1998 | Khandros et al. |
| 5,852,326 A | 12/1998 | Khandros et al. |
| 5,854,740 A | 12/1998 | Cha |
| 5,861,666 A | 1/1999 | Bellaar |
| 5,866,949 A | 2/1999 | Schueller |
| 5,874,770 A | 2/1999 | Saia et al. |
| 5,875,545 A | 3/1999 | Distefano et al. |
| 5,882,956 A | 3/1999 | Umehara et al. |
| 5,894,107 A | 4/1999 | Lee |
| 5,913,109 A | 6/1999 | Distefano et al. |
| 5,914,533 A | 6/1999 | Frech et al. |
| 5,915,170 A | 6/1999 | Raab et al. |
| 5,919,548 A | 7/1999 | Barron et al. |
| 5,925,934 A | 7/1999 | Lim |
| 5,929,517 A | 7/1999 | Distefano et al. |
| 5,932,254 A | 8/1999 | Mitchell et al. |
| 5,932,379 A | 8/1999 | Burm et al. |
| 5,939,782 A | 8/1999 | Malladi |
| 5,950,304 A | 9/1999 | Khandros et al. |
| 5,959,354 A | 9/1999 | Smith et al. |
| 5,959,357 A | 9/1999 | Korman |
| 5,969,426 A | 10/1999 | Baba et al. |
| 5,982,018 A | 11/1999 | Wark |
| 5,983,492 A | 11/1999 | Fjelstad |
| 5,989,936 A | 11/1999 | Smith et al. |
| 5,994,766 A | 11/1999 | Shenoy et al. |
| 5,994,781 A | 11/1999 | Smith |
| 6,004,867 A | 12/1999 | Kim, II et al. |
| 6,012,224 A | 1/2000 | DiStefano et al. |
| 6,013,948 A | 1/2000 | Akram et al. |
| 6,025,995 A | 2/2000 | Marcinkiewicz |
| 6,030,856 A | 2/2000 | DiStefano et al. |
| 6,040,235 A | 3/2000 | Badehi |
| 6,043,109 A | 3/2000 | Yang et al. |
| 6,045,655 A | 4/2000 | DiStefano et al. |
| 6,046,076 A | 4/2000 | Mitchell et al. |
| 6,054,337 A | 4/2000 | Solberg |
| 6,063,648 A | 5/2000 | Beroz et al. |
| 6,064,114 A | 5/2000 | Higgins, III |
| 6,071,755 A | 6/2000 | Baba et al. |
| 6,072,236 A | 6/2000 | Akram |
| 6,075,289 A | 6/2000 | Distefano |
| 6,075,710 A | 6/2000 | Lau |
| 6,080,603 A | 6/2000 | Distefano et al. |
| 6,080,605 A | 6/2000 | Distefano et al. |
| 6,087,199 A | 7/2000 | Pogge et al. |
| 6,093,584 A | 7/2000 | Fjelstad |
| 6,096,574 A | 8/2000 | Smith |
| 6,104,087 A | 8/2000 | DiStefano et al. |
| 6,107,123 A | 8/2000 | Distefano et al. |
| 6,117,707 A | 9/2000 | Badehi |
| 6,117,964 A | 9/2000 | Falcone |
| 6,118,183 A | 9/2000 | Umehara et al. |
| 6,121,676 A | 9/2000 | Solberg |
| 6,121,688 A | 9/2000 | Akagawa |
| 6,124,634 A | 9/2000 | Akram |
| 6,126,428 A | 10/2000 | Mitchell et al. |
| 6,127,724 A | 10/2000 | DiStefano |
| 6,130,116 A | 10/2000 | Smith et al. |
| 6,133,627 A | 10/2000 | Khandros et al. |
| 6,133,639 A | 10/2000 | Kovac et al. |
| 6,137,164 A | 10/2000 | Yew et al. |
| 6,147,400 A | 11/2000 | Faraci et al. |
| 6,147,401 A | 11/2000 | Solberg |
| 6,154,366 A | 11/2000 | Ma et al. |
| 6,159,767 A | 12/2000 | Eichelberger |
| 6,165,814 A | 12/2000 | Wark |
| 6,165,885 A | 12/2000 | Gaynes et al. |
| 6,168,965 B1 | 1/2001 | Malinovich |
| 6,169,328 B1 | 1/2001 | Mitchell et al. |
| 6,175,161 B1 | 1/2001 | Goetz et al. |
| 6,177,636 B1 | 1/2001 | Fjelstad |
| 6,177,731 B1 | 1/2001 | Ishida |
| 6,180,445 B1 | 1/2001 | Tsai |
| 6,187,615 B1 | 2/2001 | Kim et al. |
| 6,191,368 B1 | 2/2001 | DiStefano et al. |
| 6,194,291 B1 | 2/2001 | DiStefano et al. |
| 6,202,298 B1 | 3/2001 | Smith |
| 6,202,299 B1 | 3/2001 | Distefano et al. |
| 6,204,091 B1 | 3/2001 | Smith et al. |
| 6,207,548 B1 | 3/2001 | Akram |
| 6,211,572 B1 | 4/2001 | Fjelstad et al. |
| 6,214,640 B1 | 4/2001 | Fosberry et al. |
| 6,215,191 B1 | 4/2001 | Beroz et al. |
| 6,217,972 B1 | 4/2001 | Beroz et al. |
| 6,218,215 B1 | 4/2001 | Distefano et al. |
| 6,225,692 B1 | 5/2001 | Hinds |
| 6,228,685 B1 | 5/2001 | Beroz et al. |
| 6,228,686 B1 | 5/2001 | Smith et al. |
| 6,228,687 B1 | 5/2001 | Akram et al. |
| 6,229,100 B1 | 5/2001 | Fjelstad |
| 6,232,147 B1 | 5/2001 | Matsuki et al. |
| 6,232,152 B1 | 5/2001 | DiStefano et al. |
| 6,235,552 B1 | 5/2001 | Kwon et al. |
| 6,236,098 B1 | 5/2001 | Efland et al. |
| 6,239,384 B1 | 5/2001 | Smith et al. |

(56) References Cited

U.S. PATENT DOCUMENTS

| | | | |
|---|---|---|---|
| 6,242,282 B1 | 6/2001 | Fillion et al. | |
| 6,245,595 B1 | 6/2001 | Nguyen et al. | |
| 6,248,656 B1 | 6/2001 | Baker et al. | |
| 6,255,723 B1 | 7/2001 | Light et al. | |
| 6,255,738 B1 | 7/2001 | Distefano et al. | |
| 6,265,759 B1 | 7/2001 | DiStefano et al. | |
| 6,265,765 B1 | 7/2001 | DiStefano et al. | |
| 6,265,782 B1 | 7/2001 | Yamamoto et al. | |
| 6,274,391 B1 | 8/2001 | Wachtler et al. | |
| 6,281,588 B1 | 8/2001 | DiStefano et al. | |
| 6,284,563 B1 | 9/2001 | Fjelstad | |
| 6,286,205 B1 | 9/2001 | Faraci et al. | |
| 6,287,893 B1 | 9/2001 | Elenius | |
| 6,294,040 B1 | 9/2001 | Raab et al. | |
| 6,297,553 B1 | 10/2001 | Horiuchi et al. | |
| 6,300,231 B1 | 10/2001 | Haba et al. | |
| 6,306,680 B1 * | 10/2001 | Fillion et al. | 438/106 |
| 6,307,260 B1 | 10/2001 | Smith et al. | |
| 6,309,915 B1 | 10/2001 | DiStefano | |
| 6,312,972 B1 | 11/2001 | Blackshear | |
| 6,313,528 B1 | 11/2001 | Solberg | |
| 6,319,827 B1 | 11/2001 | Kowalski et al. | |
| 6,329,224 B1 | 12/2001 | Nguyen et al. | |
| 6,329,605 B1 | 12/2001 | Beroz et al. | |
| 6,329,607 B1 | 12/2001 | Fjelstad et al. | |
| 6,338,982 B1 | 1/2002 | Beroz et al. | |
| 6,344,401 B1 | 2/2002 | Lam | |
| 6,344,695 B1 | 2/2002 | Murayama | |
| 6,348,728 B1 | 2/2002 | Aiba et al. | |
| 6,350,668 B1 | 2/2002 | Chakravorty | |
| 6,354,485 B1 | 3/2002 | Distefano | |
| 6,355,507 B1 * | 3/2002 | Fanworth | 438/127 |
| 6,358,780 B1 | 3/2002 | Smith et al. | |
| 6,359,236 B1 | 3/2002 | DiStefano et al. | |
| 6,359,335 B1 | 3/2002 | Distefano et al. | |
| 6,361,959 B1 | 3/2002 | Beroz et al. | |
| 6,365,436 B1 | 4/2002 | Faraci et al. | |
| 6,365,975 B1 | 4/2002 | DiStefano et al. | |
| 6,370,032 B1 | 4/2002 | DiStefano et al. | |
| 6,372,527 B1 | 4/2002 | Khandros et al. | |
| 6,373,141 B1 | 4/2002 | DiStefano et al. | |
| 6,376,279 B1 | 4/2002 | Kwon et al. | |
| 6,378,758 B1 | 4/2002 | Haba | |
| 6,383,858 B1 | 5/2002 | Gupta et al. | |
| 6,384,473 B1 | 5/2002 | Peterson et al. | |
| 6,384,475 B1 | 5/2002 | Beroz et al. | |
| 6,388,340 B2 | 5/2002 | Distefano | |
| 6,392,306 B1 | 5/2002 | Khandros et al. | |
| 6,396,148 B1 | 5/2002 | Eichelberger | |
| 6,400,573 B1 | 6/2002 | Mowatt et al. | |
| 6,414,390 B2 | 7/2002 | Nozawa | |
| 6,420,661 B1 | 7/2002 | DiStefano et al. | |
| 6,423,570 B1 | 7/2002 | Ma et al. | |
| 6,423,907 B1 | 7/2002 | Haba et al. | |
| 6,429,112 B1 | 8/2002 | Smith et al. | |
| 6,433,419 B2 | 8/2002 | Khandros et al. | |
| 6,448,171 B1 * | 9/2002 | Wang et al. | 438/614 |
| 6,458,623 B1 * | 10/2002 | Goldmann et al. | 438/107 |
| 6,458,628 B1 | 10/2002 | Distefano et al. | |
| 6,458,681 B1 | 10/2002 | Distefano et al. | |
| 6,458,682 B2 * | 10/2002 | Watanabe | 438/612 |
| 6,459,150 B1 | 10/2002 | Wu et al. | |
| 6,460,245 B1 | 10/2002 | DiStefano | |
| 6,465,744 B2 | 10/2002 | Baker et al. | |
| 6,465,878 B2 | 10/2002 | Fjelstad et al. | |
| 6,465,893 B1 | 10/2002 | Khandros et al. | |
| 6,468,836 B1 | 10/2002 | DiStefano et al. | |
| 6,476,506 B1 | 11/2002 | O'Connor | |
| 6,476,507 B1 | 11/2002 | Takehara | |
| 6,482,730 B1 | 11/2002 | Masumoto et al. | |
| 6,486,003 B1 | 11/2002 | Fjelstad | |
| 6,486,547 B2 | 11/2002 | Smith et al. | |
| 6,492,201 B1 | 12/2002 | Haba | |
| 6,492,251 B1 | 12/2002 | Haba et al. | |
| 6,492,829 B1 | 12/2002 | Miura et al. | |
| 6,495,462 B1 | 12/2002 | Haba et al. | |
| 6,499,216 B1 | 12/2002 | Fjelstad | |
| 6,504,227 B1 | 1/2003 | Matsuo et al. | |
| 6,507,122 B2 | 1/2003 | Blackshear | |
| 6,518,662 B1 | 2/2003 | Smith et al. | |
| 6,521,480 B1 | 2/2003 | Mitchell et al. | |
| 6,525,429 B1 | 2/2003 | Kovac et al. | |
| 6,538,210 B2 | 3/2003 | Sugaya et al. | |
| 6,541,310 B1 * | 4/2003 | Lo et al. | 438/122 |
| 6,541,852 B2 | 4/2003 | Beroz et al. | |
| 6,541,874 B2 | 4/2003 | Nguyen et al. | |
| 6,543,131 B1 | 4/2003 | Beroz et al. | |
| 6,555,469 B1 | 4/2003 | MacIntyre | |
| 6,555,908 B1 | 4/2003 | Eichelberger et al. | |
| 6,557,253 B1 | 5/2003 | Haba et al. | |
| 6,558,976 B2 | 5/2003 | Shrauger | |
| 6,570,101 B2 | 5/2003 | Stefano et al. | |
| 6,573,584 B1 | 6/2003 | Nagakari et al. | |
| 6,573,609 B2 | 6/2003 | Fjelstad et al. | |
| 6,602,740 B1 | 8/2003 | Mitchell | |
| 6,620,720 B1 | 9/2003 | Moyer | |
| 6,624,505 B2 | 9/2003 | Badehi | |
| 6,625,037 B2 | 9/2003 | Nakatani et al. | |
| 6,632,733 B2 | 10/2003 | Mohammed | |
| 6,635,514 B1 | 10/2003 | Fjelstad | |
| 6,635,553 B1 | 10/2003 | DiStefano et al. | |
| 6,639,324 B1 | 10/2003 | Chien | |
| 6,651,321 B2 | 11/2003 | Beroz et al. | |
| 6,653,172 B2 | 11/2003 | DiStefano et al. | |
| 6,657,286 B2 | 12/2003 | Light | |
| 6,664,484 B2 | 12/2003 | Haba et al. | |
| 6,664,621 B2 | 12/2003 | Smith et al. | |
| 6,686,015 B2 | 2/2004 | Raab et al. | |
| 6,687,842 B1 | 2/2004 | DiStefano et al. | |
| 6,690,186 B2 | 2/2004 | Fjelstad | |
| 6,699,730 B2 | 3/2004 | Kim et al. | |
| 6,707,124 B2 | 3/2004 | Wachtler et al. | |
| 6,707,159 B1 | 3/2004 | Kumamoto | |
| 6,709,895 B1 | 3/2004 | DiStefano | |
| 6,710,454 B1 | 3/2004 | Boon | |
| 6,713,589 B2 | 3/2004 | Sue et al. | |
| 6,723,584 B2 | 4/2004 | Kovac et al. | |
| 6,734,534 B1 | 5/2004 | Vu et al. | |
| 6,737,265 B2 | 5/2004 | Beroz et al. | |
| 6,750,539 B2 | 6/2004 | Haba et al. | |
| 6,763,579 B2 | 7/2004 | Haba et al. | |
| 6,765,299 B2 | 7/2004 | Takahashi | |
| 6,774,317 B2 | 8/2004 | Fjelstad | |
| 6,777,767 B2 | 8/2004 | Badehi | |
| 6,780,747 B2 | 8/2004 | Distefano et al. | |
| 6,820,330 B1 | 11/2004 | Haba | |
| 6,821,815 B2 | 11/2004 | Smith et al. | |
| 6,822,320 B2 | 11/2004 | Haba | |
| 6,826,827 B1 | 12/2004 | Fjelstad | |
| 6,828,668 B2 | 12/2004 | Smith et al. | |
| 6,838,750 B2 | 1/2005 | Nuytkens et al. | |
| 6,847,101 B2 | 1/2005 | Fjelstad et al. | |
| 6,847,107 B2 | 1/2005 | Fjelstad et al. | |
| 6,848,173 B2 | 2/2005 | Fjelstad et al. | |
| 6,856,007 B2 | 2/2005 | Warner | |
| 6,867,065 B2 | 3/2005 | Beroz | |
| 6,867,499 B1 | 3/2005 | Tabrizi | |
| 6,870,272 B2 | 3/2005 | Kovac et al. | |
| 6,876,212 B2 | 4/2005 | Fjelstad | |
| 6,885,106 B1 | 4/2005 | Damberg et al. | |
| 6,924,171 B2 * | 8/2005 | Buchwalter et al. | 438/106 |
| 6,952,047 B2 | 10/2005 | Li | |
| 6,965,158 B2 | 11/2005 | Smith et al. | |
| 6,972,480 B2 | 12/2005 | Zilber | |
| 7,012,323 B2 | 3/2006 | Warner et al. | |
| 7,033,664 B2 | 4/2006 | Zilber et al. | |
| 7,098,078 B2 | 8/2006 | Khandros et al. | |
| 7,112,879 B2 | 9/2006 | Fjelstad et al. | |
| 7,114,250 B2 | 10/2006 | Haba et al. | |
| 7,138,299 B2 | 11/2006 | Fjelstad | |
| 7,144,745 B2 | 12/2006 | Badehi | |
| 7,149,095 B2 | 12/2006 | Warner et al. | |
| 7,152,311 B2 | 12/2006 | Beroz et al. | |
| 7,166,914 B2 | 1/2007 | DiStefano et al. | |

(56) References Cited

U.S. PATENT DOCUMENTS

| | | |
|---|---|---|
| 7,176,506 B2 | 2/2007 | Beroz et al. |
| 7,183,643 B2 | 2/2007 | Gibson et al. |
| 7,192,796 B2 | 3/2007 | Zilber et al. |
| 7,198,969 B1 | 4/2007 | Khandros et al. |
| 7,208,820 B2 | 4/2007 | Mohammed |
| 7,229,850 B2 | 6/2007 | Li |
| 7,265,440 B2 | 9/2007 | Zilber et al. |
| 7,268,426 B2 | 9/2007 | Warner et al. |
| 7,271,481 B2 | 9/2007 | Khandros et al. |
| 7,272,888 B2 | 9/2007 | DiStefano |
| 7,291,910 B2 | 11/2007 | Khandros et al. |
| 7,368,818 B2 | 5/2008 | Kovac et al. |
| 7,408,260 B2 | 8/2008 | Fjelstad et al. |
| 7,408,261 B2 | 8/2008 | Yoon et al. |
| 7,427,423 B2 | 9/2008 | Beroz et al. |
| 7,449,412 B2 | 11/2008 | Nuytkens et al. |
| 7,454,834 B2 | 11/2008 | DiStefano et al. |
| 7,462,932 B2 | 12/2008 | Haba et al. |
| 7,498,196 B2 * | 3/2009 | Lee et al. ............ 438/108 |
| 7,528,008 B2 | 5/2009 | Fjelstad |
| 7,531,894 B2 | 5/2009 | Fjelstad |
| 7,566,955 B2 | 7/2009 | Warner |
| 7,589,409 B2 | 9/2009 | Gibson et al. |
| 7,754,537 B2 | 7/2010 | Haba et al. |
| 2001/0000032 A1 | 3/2001 | Smith et al. |
| 2001/0005044 A1 | 6/2001 | Fjelstad |
| 2001/0007375 A1 | 7/2001 | Fjelstad et al. |
| 2001/0010400 A1 | 8/2001 | Smith |
| 2001/0019905 A1 | 9/2001 | DiStefano et al. |
| 2001/0021541 A1 | 9/2001 | Akram et al. |
| 2001/0022396 A1 | 9/2001 | DiStefano et al. |
| 2001/0030370 A1 | 10/2001 | Khandros et al. |
| 2001/0031514 A1 | 10/2001 | Smith |
| 2001/0033474 A1 | 10/2001 | Sakai et al. |
| 2001/0037863 A1 | 11/2001 | Carson et al. |
| 2001/0040290 A1 | 11/2001 | Sakurai |
| 2001/0042901 A1 | 11/2001 | Maruyama |
| 2001/0050425 A1 | 12/2001 | Beroz et al. |
| 2002/0001966 A1 | 1/2002 | Ito et al. |
| 2002/0004288 A1 | 1/2002 | Nishiyama |
| 2002/0006718 A1 | 1/2002 | Distefano |
| 2002/0007904 A1 | 1/2002 | Raab et al. |
| 2002/0009827 A1 | 1/2002 | Beroz et al. |
| 2002/0011663 A1 | 1/2002 | Khandros et al. |
| 2002/0017730 A1 | 2/2002 | Tahara et al. |
| 2002/0030273 A1 | 3/2002 | Iwamoto et al. |
| 2002/0063304 A1 | 5/2002 | Toeda et al. |
| 2002/0068384 A1 | 6/2002 | Beroz et al. |
| 2002/0068426 A1 | 6/2002 | Fjelstad et al. |
| 2002/0074641 A1 | 6/2002 | Towle et al. |
| 2002/0075016 A1 | 6/2002 | Fjelstad et al. |
| 2002/0079575 A1 | 6/2002 | Hozoji et al. |
| 2002/0084510 A1 | 7/2002 | Jun et al. |
| 2002/0094671 A1 | 7/2002 | Distefano et al. |
| 2002/0096787 A1 | 7/2002 | Fjelstad |
| 2002/0100961 A1 | 8/2002 | Fjelstad et al. |
| 2002/0109213 A1 | 8/2002 | Kovac et al. |
| 2002/0115236 A1 | 8/2002 | Fjelstad et al. |
| 2002/0121689 A1 | 9/2002 | Honda |
| 2002/0135063 A1 | 9/2002 | Alcoe et al. |
| 2002/0137263 A1 | 9/2002 | Towle et al. |
| 2002/0142521 A1 | 10/2002 | Steffens |
| 2002/0148639 A1 | 10/2002 | Smith et al. |
| 2002/0155728 A1 | 10/2002 | Khandros et al. |
| 2002/0158334 A1 | 10/2002 | Vu et al. |
| 2002/0163055 A1 | 11/2002 | Thomas |
| 2002/0168797 A1 | 11/2002 | DiStefano |
| 2002/0170746 A1 | 11/2002 | Master et al. |
| 2002/0180041 A1 | 12/2002 | Sahara et al. |
| 2002/0184758 A1 | 12/2002 | DiStefano |
| 2002/0195685 A1 | 12/2002 | Fjelstad et al. |
| 2003/0020180 A1 | 1/2003 | Ahn et al. |
| 2003/0025192 A1 | 2/2003 | Haba |
| 2003/0027373 A1 | 2/2003 | DiStefano |
| 2003/0027374 A1 | 2/2003 | Kovac et al. |
| 2003/0060032 A1 | 3/2003 | Beroz et al. |
| 2003/0071346 A1 | 4/2003 | Smith et al. |
| 2003/0080437 A1 | 5/2003 | Gonzalez et al. |
| 2003/0118738 A1 | 6/2003 | Shuy et al. |
| 2003/0168253 A1 | 9/2003 | Khandros et al. |
| 2004/0035519 A1 | 2/2004 | Beroz |
| 2004/0080328 A1 | 4/2004 | Fjelstad |
| 2004/0227225 A1 | 11/2004 | Fjelstad et al. |
| 2004/0251525 A1 | 12/2004 | Zilber et al. |
| 2004/0262742 A1 | 12/2004 | DiStefano et al. |
| 2005/0085012 A1 | 4/2005 | Fjelstad |
| 2005/0087855 A1 | 4/2005 | Khandros et al. |
| 2005/0139986 A1 | 6/2005 | Kovac et al. |
| 2005/0155223 A1 | 7/2005 | Fjelstad et al. |
| 2005/0194672 A1 | 9/2005 | Gibson et al. |
| 2005/0205977 A1 | 9/2005 | Zilber et al. |
| 2005/0218495 A1 | 10/2005 | Khandros et al. |
| 2006/0001152 A1 | 1/2006 | Hu |
| 2006/0049498 A1 | 3/2006 | Kovac et al. |
| 2006/0113645 A1 | 6/2006 | Warner et al. |
| 2006/0225272 A1 | 10/2006 | Distefano |
| 2006/0237836 A1 | 10/2006 | Fjelstad et al. |
| 2006/0244135 A1 | 11/2006 | Khandros et al. |
| 2006/0261476 A1 | 11/2006 | Fjelstad et al. |
| 2007/0066046 A1 | 3/2007 | Fjelstad |
| 2007/0096160 A1 | 5/2007 | Beroz et al. |
| 2007/0290316 A1 | 12/2007 | Gibson et al. |
| 2008/0012115 A1 | 1/2008 | Zilber et al. |
| 2008/0315424 A1 | 12/2008 | Lee et al. |
| 2009/0008778 A1 | 1/2009 | Lee et al. |
| 2009/0200654 A1 | 8/2009 | Fjelstad |
| 2009/0200655 A1 | 8/2009 | Fjelstad |
| 2009/0236406 A1 | 9/2009 | Fjelstad |
| 2009/0289346 A1 | 11/2009 | Lee et al. |
| 2010/0013108 A1 | 1/2010 | Gibson |
| 2013/0221512 A1 | 8/2013 | Lee et al. |

FOREIGN PATENT DOCUMENTS

| | | |
|---|---|---|
| TW | 408855 | 10/2000 |
| TW | 413399 | 11/2000 |
| TW | 426226 | 3/2001 |
| TW | 429563 | 4/2001 |
| TW | 456006 | 9/2001 |
| TW | 466655 | 12/2001 |
| WO | WO9609746 | 3/1996 |
| WO | WO9711588 | 3/1997 |
| WO | WO9828955 | 7/1998 |
| WO | WO9844564 | 10/1998 |
| WO | WO9940761 | 8/1999 |
| WO | WO0054321 | 9/2000 |
| WO | WO03021673 | 3/2003 |
| WO | WO2004080134 | 9/2004 |

OTHER PUBLICATIONS

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High vol. Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of

(56) References Cited

OTHER PUBLICATIONS the 6th International Sympoisum on Physical & Failure Analysis of Integrated Circuits (1997) pp. 121-124.
Edelstein, D. et al. "Full Copper Wiring in a Sub-0.25 pm CMOS ULSI Technology," Technical Digest IEEE International Electron Devices Meeting (1997) pp. 773-776.
Venkatesan, S. et al. "A High Performance 1.8V, 0.20 pm CMOS Technology with Copper Metallization," Technical Digest IEEE International Electron Devices Meeting (1997) pp. 769-772.
Jenei, S. et al. "High Q Inductor Add-on Module in Thick Cu/SiLK™ single damascene," Proceedings from the IEEE International Interconnect Technology Conference (2001) pp. 107-109.
Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.
Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.
Kumar, R. et al. "A Family of 45nm IA Processors," IEEE International Solid-State Circuits Conference, Session 3, Microprocessor Technologies, 3.2 (2009) pp. 58-59.
Bohr, M. "The New Era of Scaling in an SoC World," International Solid-State Circuits Conference (2009) Presentation Slides 1-66.
Bohr, M. "The New Era of Scaling in an SoC World," International Solid-State Circuits Conference (2009) pp. 23-28.
Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.
Kurd, N. et al. "Next Generation Intel® Micro-architecture (Nehalem) Clocking.Architecture," Symposium on VLSI Circuits Digest of Technical Papers (2008) pp. 62-63.
Maloney, T. et al. "Novel Clamp Circuits for IC Power Supply Protection," IEEE Tranactions on Components, Packaging, and Manufacturing Technology, Part C, vol. 19, No. 3 (Jul. 1996) pp. 150-161.
Geffken, R. M. "An Overview of Polyimide Use in Integrated Circuits and Packaging," Proceedings of the Third International Symposium on Ultra Large Scale Integration Science and Technology (1991) pp. 667-677.
Luther, B. et al. "Planar Copper-Polyimide Back End of the Line Interconnections for ULSI Devices," Proceedings of the 10th International IEEE VLSI Multilevel Interconnection Conference (1993) pp. 15-21.
Master, R. et al. "Ceramic Mini-Ball Grid Array Package for High Speed Device," Proceedings from the 45th Electronic Components and Technology Conference (1995) pp. 46-50.
Maloney, T. et al. "Stacked PMOS Clamps for High Voltage Power Supply Protection," Electrical Overstress/Electrostatic Discharge Symposium Proceedings (1999) pp. 70-77.
Lin, M.S. et al. "A New System-on-a-Chip (SoC) Technology—High Q Post Passivation Inductors," Proceedings from the 53rd Electronic Components and Technology Conference (May 30, 2003) pp. 1503-1509.
MEGIC Corp. "MEGIC way to system solutions through bumping and redistribution," (Brochure) (Feb. 6, 2004) pp. 1-3.
Lin, M.S. "Post Passivation Technology™—MEGIC® Way to System Solutions," Presentation given at TSMC Technology Symposium, Japan (Oct. 1, 2003) pp. 1-32.
Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.
Hiraiwa, Katsuro, et al. "Advanced LSI Packaging Technologies," pp. 99-107, Fujitsu Sci. Tech. J., 36, 1 (Jun. 2000).
Lau, J. et al. "Chip Scale Package—Design Materials Process Reliability and Applications", Chapt 10, pp. 157-161, McGraw-Hill professional, 1990.
Millman, Jacob; "Digital and Analog Circuits and Systems", Micro Electronic, Mar. 1979, p. 115 & p. 167, Sec 4-11 & Sec 6-1, McGraw-Hill College.
Tummala, Rao et al.; "An Overview & 8-2 Chip-Level Interconnection Evolution, Springer", Microelectronics Packaging Handbook (Second Edition), Technology Drivers Part I, Jan. 31, 1997, p. 12-13, p. 64-65, p. 82-87, p. 133.

* cited by examiner

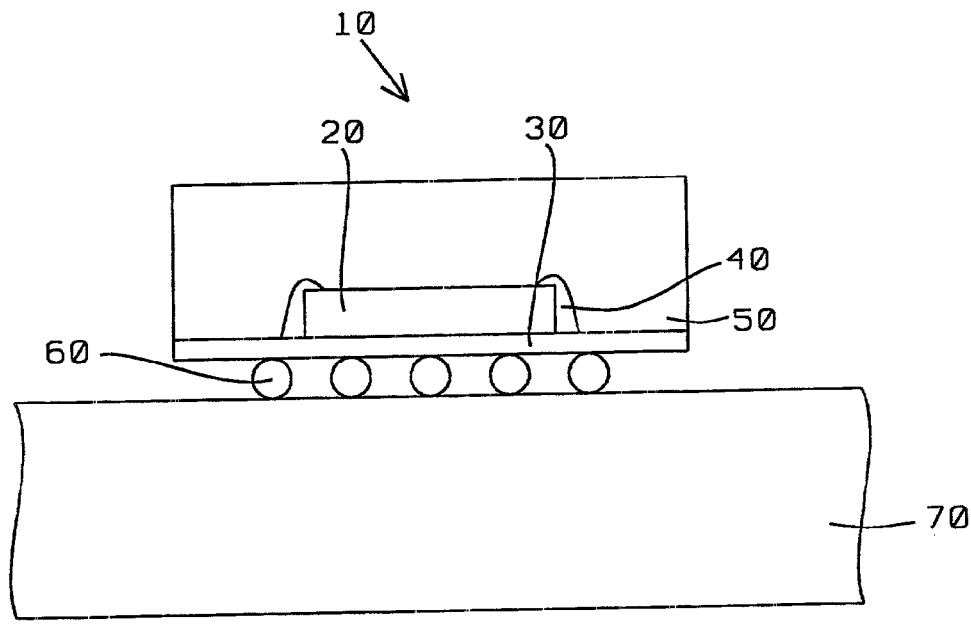
FIG. 1 – Prior Art
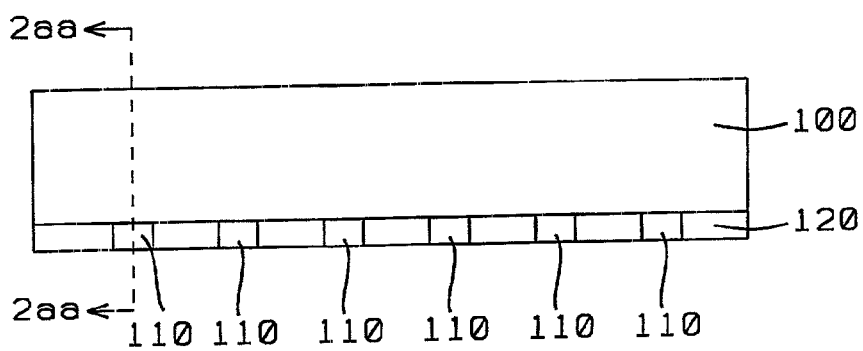
FIG. 2a
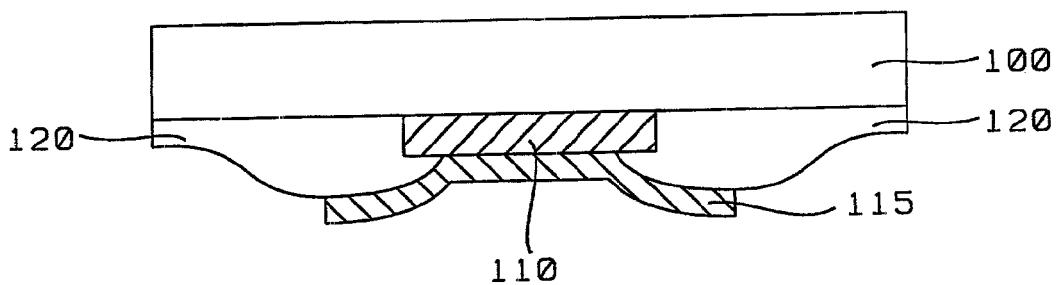
FIG. 2aa

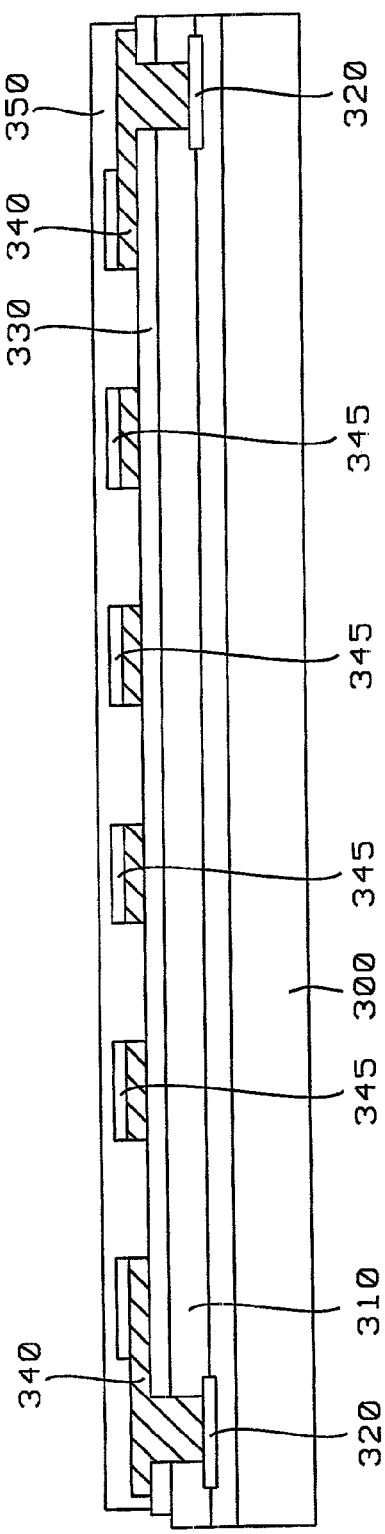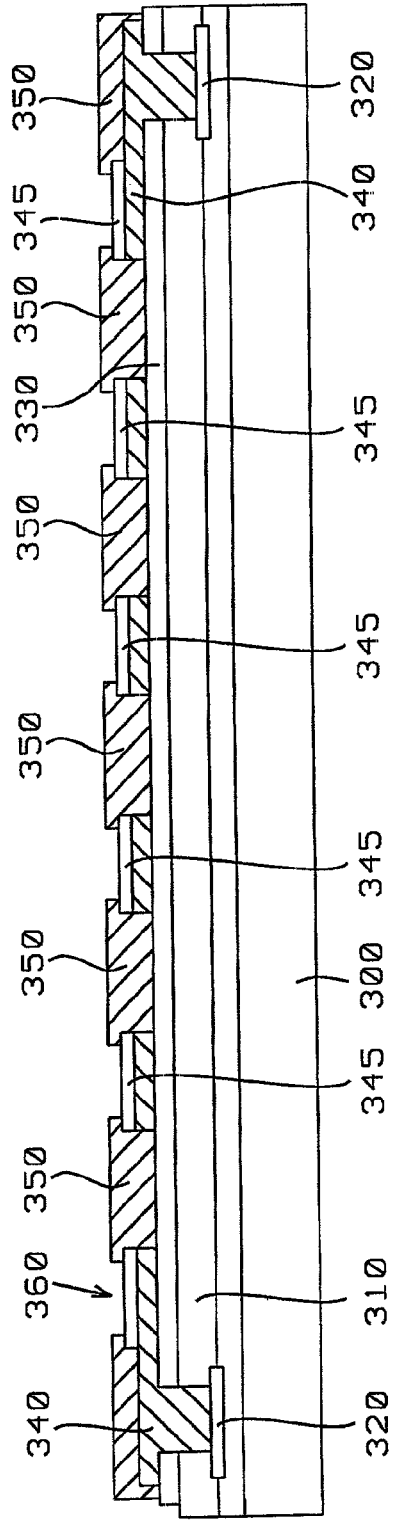
FIG. 3a
FIG. 3b

METHOD OF FABRICATING CHIP PACKAGE

This application is a continuation of application Ser. No. 09/821,546, filed on Mar. 30, 2001, now U.S. Pat. No. 7,498,196.

BACKGROUND OF THE INVENTION (1) Field of the Invention

The present invention relates to the manufacture of integrated circuit (IC) chips, and in particular to the packaging of chips at the chip level. At the same time, packaging of chips relates to chip bonding, including the current wire bonding, to Chip Scale Packaging (CSP) test fixture concerns, and the attendant reliability concerns.

(2) Description of the Related Art

Packaging of IC chips determines to a large extent the performance of the system of which the chips are the smallest building blocks. As-one chip must communicate with one or more other neighboring chips in order to perform a system function, the method by which the chips are packaged and interconnected makes a difference in their speed of communication. For example, current mini-BGA (Ball-Grid-Array) packages using wire bonding as interconnection are not as effective in high frequency circuit applications. Also, chip scale packaging (CSP) is important in determining the type of fixtures that must be used for testing. It is disclosed later in the embodiments of the present invention a CSP package and a method of manufacturing the same which substantially improves the performance of the IC chips as well as the testing cost of the chips.

As is known in the art, integrated circuits are formed on a silicon wafer which is then diced or cut to form individual die, also called chips. The circuits which are interconnected in each chip terminate at terminals on the chip. The appropriate chips are then interconnected with each other by bonding those terminals onto a card having its own interconnections. Depending upon the complexity and function of the final machine that is to be built, this first level package may in turn be interconnected with other first level cards by connecting the cards onto a second level package, usually called a board.

The chip level interconnection forming the first level package is usually performed using wirebonding (WB), tape automated bonding (TAB), or flip-chip solder connection, sometimes referred to as controlled collapse chip connection (C4). A detailed description of each of these interconnection schemes will not be given here so as to not obscure the key aspects of the present invention, and also, as they are not necessary to the understanding of the teachings of the present invention.

A conventional first level mini-BGA package, (10), is shown in prior art FIG. 1. The die, or chip (20) is wire-bonded (40) to substrate (30), which in turn is connected to second level package (70) through solder connections (60). The mini-BGA package Ls always encapsulated in a molding material (50). It will be known to those skilled in the art that it would be desirable to eliminate wires (40). Such a method is disclosed later in the embodiments of the present invention. Some other prior methods of making connections to chips are disclosed in U.S. Pat. Nos. 5,994,766 by Shenoy et al., 6,118,183 by Umehara, et al., 6,137,164 by Yew et al., 5,734,201 by Djennas et al, and 5,914,533 by Frech et al., where they use redistribution layers. Lau, on the other hand, shows a low-cost surface mount compatible land-grid array (LGA) chip scale package (CSP) for packaging solder-bumped flip chips. Higgins also discloses a CSP mounted to a substrate using direct chip attach (DCA) method.

The present invention, as disclosed later, differs from prior art in that a CSP is formed by integrating a redistributed chip on a substrate. The I/O solder balls are first mounted through the substrate vias, which in turn are connected to the chip I/O pads. The substrate is attached to the chip by an adhesive.

SUMMARY OF THE INVENTION

It is therefore an object of this invention to provide a Chip Scale Package (CSP) having improved chip attachment especially suited for high frequency circuit application.

It is another object of the present invention to provide a more reliable CSP than current CSP.

It is still another object of the present invention to provide a CSP which leverages current test infrastructure to be more cost effective.

It is yet another object of the present invention to provide a method of forming CSP with improved interconnections.

It is an overall object of the present invention to provide a method of attaching chips directly to an adhesive-substrate (adsubstrate) as well as attaching an adhesive-wafer (adwafer) directly to a substrate in order to form CSPs with minimized interconnection lengths and hence, enhanced circuit speed.

The objects of the invention are accomplished by providing a silicon chip having I/O pads; an under-ball metallurgy (UBM) layer on the surface of said I/O pads; a substrate with an adhesive (adsubstrate), and having openings corresponding to the locations of said I/O pads; and ball mountings formed over said adsubstrate and reaching said UBM layer over said I/O pads on said chip.

The objects are further accomplished by providing a wafer having a plurality of chip sites with I/O pads; forming an under-ball metal (UBM) layer over said I/O pads; forming an adhesive layer over said UBM layer on said wafer to form an adwafer; forming openings in said adhesive layer on said adwafer to reach said I/O pads underlying said UBM layer; die sawing said adwafer to form said chip scale package (CSP); providing a substrate having openings corresponding to said I/O pads; attaching said CSP with said adhesive to said substrate; and forming ball mountings on said openings on said substrate to attach to said I/O pads on said CSP.

BRIEF DESCRIPTION OF THE DRAWINGS

FIG. 1 is a cross-sectional view of a portion of a conventional mini-BGA, according to prior art.

FIG. 2a is a cross-sectional view of a portion of a semiconductor chip showing the forming of an area array I/O pads, according to the present invention.

FIG. 2aa is a transverse cross-sectional view of a portion of the semiconductor chip of FIG. 2a showing the UBM layer on the I/O pads, according to the present invention.

FIG. 3a is a cross-sectional view of a portion of a wafer showing the forming of an adhesive layer, according to the present invention.

FIG. 3b is a cross-sectional view of a portion of the wafer of FIG. 3a showing the opening of the area array I/O pads, according to the present invention.

DESCRIPTION OF THE PREFERRED EMBODIMENTS

Figure 2B:
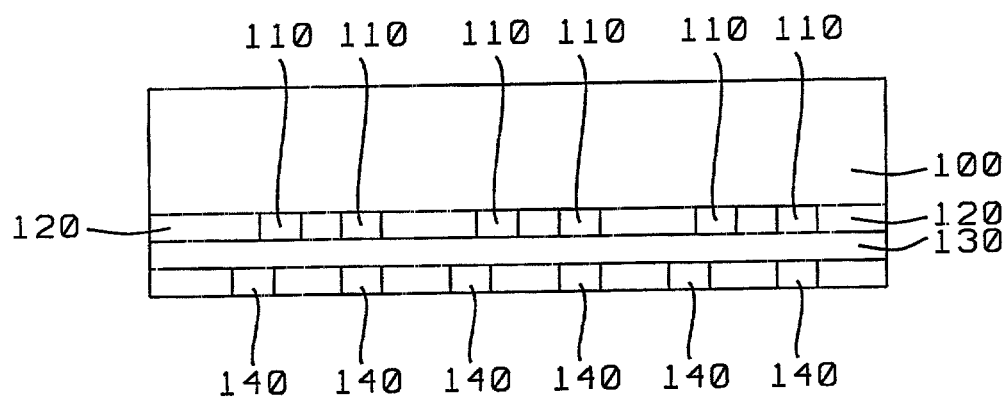
FIG. 2b is a cross-sectional view of a portion of a semiconductor chip showing the redistribution of I/O pads in a redistribution layer to form an area array of I/O pads, according to the present invention.

Referring now to the drawings, that is, to FIGS. 2a-2i, and FIGS. 3a-3g, there are shown steps of forming a Chip Scale Package (CSP) with improved interconnections.

More specifically, FIGS. 2a and 2b show two single chips die sawed from a wafer, preferably silicon. Chip (100) in FIG. 2a is either already designed to have an area array (AA) of input-output (I/O) pads (110) in passivation layer (120), or, optionally, the same chip in FIG. 2b has normal design I/O pads which have subsequently been redistributed in a re-routing (RR) layer (130) to form redistributed AA pads (140) as shown in FIG. 2b. An under-ball metallurgy layer, comprising nickel and copper, that is, (UBM) layer (115), is also formed over pads (110) or (140), better seen in cross-sectional view in FIG. 2aa. It is important that the pads on chips are generally in an area array configuration for easier connection to the next level of packaging, as is known in the art.

It is also known in the art that chip sites are first formed on a semiconductor substrate to form a wafer, where the substrate is provided with pads (110/115) or (140/115) that are connected to underlying multi-level metal layers through intervening insulating dielectric layers, and ultimately to integrated circuit devices that have already been conventionally formed within and on the substrate. These conventional steps are well known in the art and as they are not significant to the invention, they are not described in detail here in order not to unnecessarily obscure the present invention. However, it is described below in the embodiments of the present invention a new method of forming a chip scale package (CSP) where the I/O ball connections are directly reflowed to the chip pads through vias formed in an intervening next level of substrate.

Figure 2C:
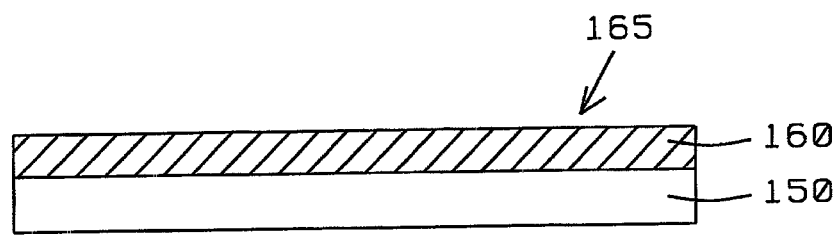
FIG. 2c is a cross-sectional view of a portion of a composite adsubstrate structure comprising an adhesive layer formed over a substrate, according to the present invention.
Figure 2D:
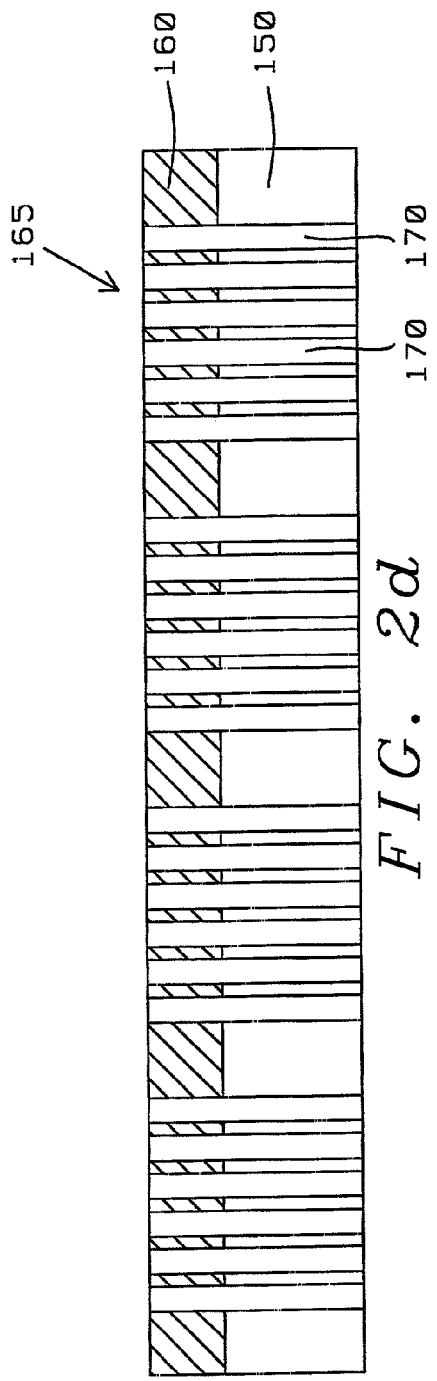
FIG. 2d is a cross-sectional view of a portion of the adsubstrate of FIG. 2c showing the forming of through via holes, according to the present invention.
Figure 2E:
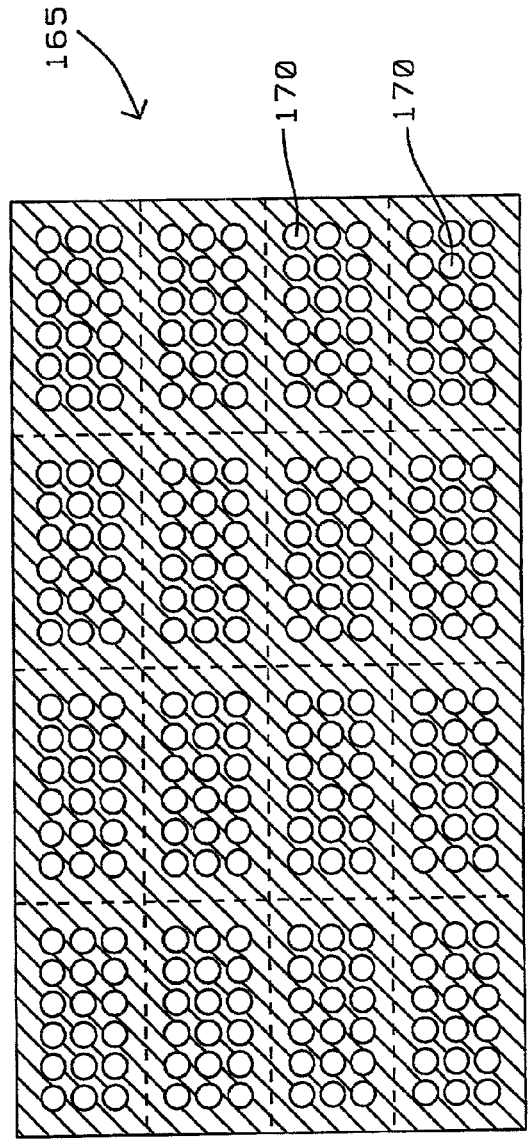
FIG. 2e is a top view of a portion the adsubstrate of FIG. 2d showing the area array of via openings, according to the present invention.

Thus, as a key aspect of the present invention, substrate (150), preferably a bismaleimide triazine (BT), having a thickness between about 150 to 300 micrometers is mounted with adhered to an adhesive layer (160), having a thickness between about 10 to 100 micrometers. Layer (160) can be a polyimide thermocompression adhesive SPA made by Nippon Steel Chemical. The adhesive and the substrate together form an "adsubstrate" composite structure, reference numeral (165), as shown in FIG. 2c. The composite adsubstrate is then either mechanically drilled, or, preferably laser drilled with an area array of via openings (170) that correspond to AA I/O pads (110) or (140) on the chip, as shown in FIG. 2d. A top view of the adsubstrate with AA openings is also shown in FIG. 2e.

Figure 2F:
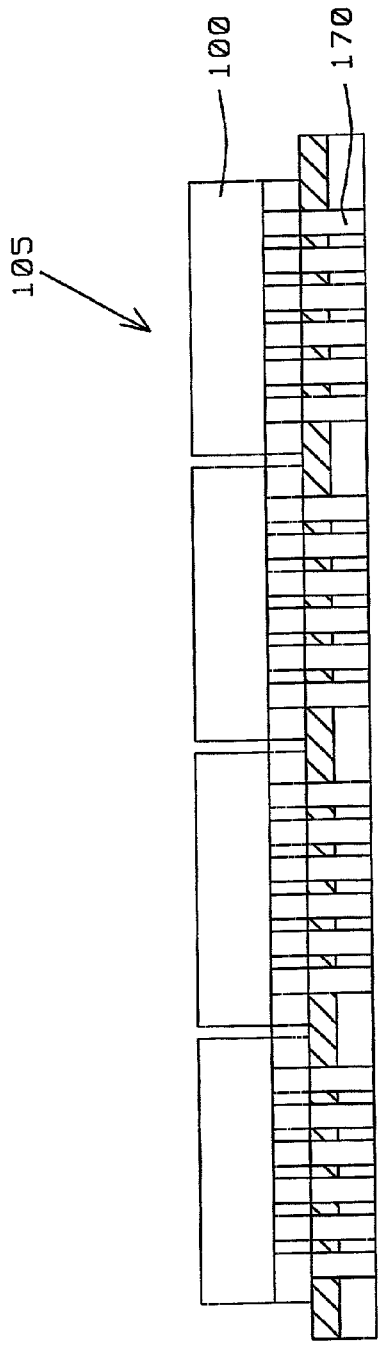
FIG. 2f is a cross-sectional view of a portion of a chip package formed by adhering a multiplicity of chips to the adsubstrate of FIG. 2d, according to the present invention.
Figure 2G:
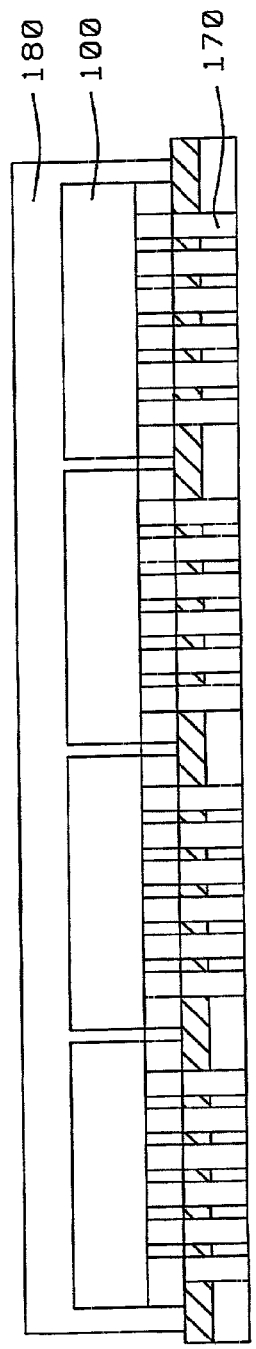
FIG. 2g is a cross-sectional view of a portion of the chip package of FIG. 2f showing the encapsulation of the same, according to the present invention.

It is important that the vias in the adsubstrate align with the I/O pads on the chip, for at the next key step, the chips are attached to the adsubstrate to form a chip package, reference numeral (105), as shown in FIG. 2f such that the vias (170) reach the I/O pads. The attachment is achieved by subjecting the chip package to an assembly pressure between about 1.5 to 2.5 Megapascals (Mpa) and at the same time, to a temperature between about 250 to 350.degree. C. Next, the chip package assembly is encapsulated with a molding material (180), preferably, epoxy based resin to a thickness between about 100 to 500 micrometers, as shown in FIG. 2g. It will be obvious to those skilled in the art that other molding materials for electronics can also be used.

Figure 2H:
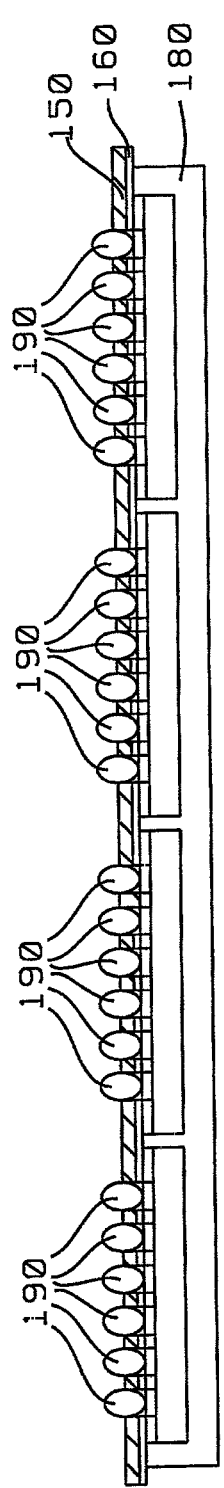
FIG. 2h is a cross-sectional view of a portion of the encapsulate chip package of FIG. 2g showing the forming of ball mounts, according to the present invention.
Figure 2J:
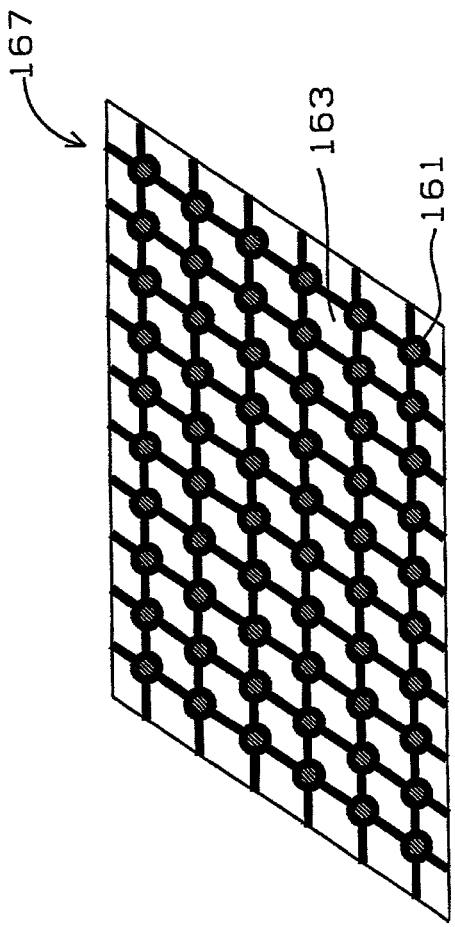
FIG. 2j is a top view of a portion of the patterned stencil where solid areas (161) prevent the adhesive material printing to the substrate while open areas (163) allow the adhesive material to print on the substrate, thus forming the adsubstrate of FIG. 2e, according to the present invention.
Figure 2I:
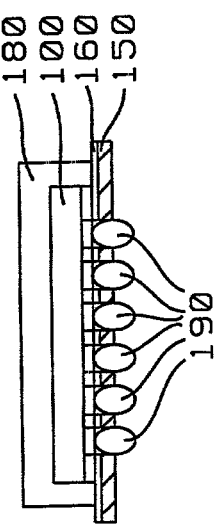
FIG. 2i is a cross-sectional view of a portion of the chip scale package (CSP) of the present invention after sawing off of the same from the chip package of FIG. 2h, according to the present invention.

It is now a main feature of the present invention to perform ball mounting over the via openings of the adsubstrate, where the chip package is inverted such that the mounting material (190), preferably, solder is "balled" up as shown in FIG. 2h. It is further preferred that the solder (190) comprises tin-lead, or, tin-silver alloy. During continued process, solder flows to reach the I/O pads at the bottom of the vias, as shown in FIG. 2h. As a final step, the encapsulated chip package is die sawed to form the Chip Scale Package (CSP) of the present invention, as shown in FIG. 2i. FIG. 2j shows an alternate method of silk screening an adhesive material on to substrate (167) with holes corresponding to the AA I/O pads on the chip. That is, FIG. 2j is a top view of a portion of the patterned stencil where solid areas (161) prevent the adhesive material (160) printing to the substrate (150) while open areas (163) allow the adhesive material (160) to print on the substrate (150), thus forming the adsubstrate (165) of FIG. 2e.

Figures 3C, 3D:
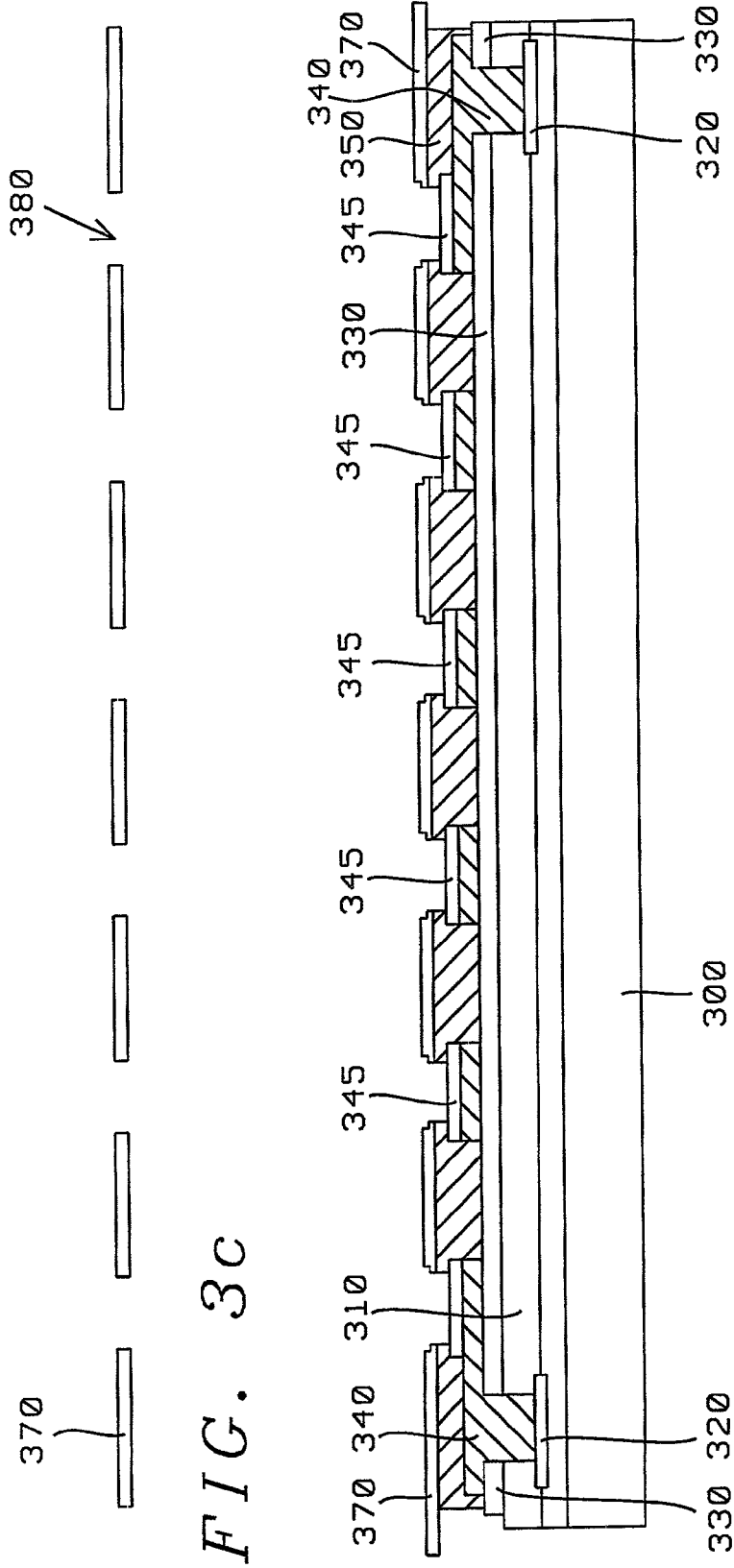
FIG. 3c is a cross-sectional view of a portion of a substrate showing the area array openings, according to the present invention.
FIG. 3d is a cross-sectional view of a portion of the substrate of FIG. 3c and of the wafer of FIG. 3b showing the attachment to each other, according to the present invention.

In a second embodiment shown in FIGS. 3a-3f, the main feature is where the adhesive material is applied to wafer (300) to form an "adwafer" first. The adwafer, with a plurality of chip sites, has aluminum pads (320) with an optional re-routing (RR) dielectric layer (330) and passivation layer (310) separating the pads from adhesive layer (350), as shown in FIG. 3a. It will be noted that the I/O pads are connected to RR metal layer (340) which redistributes the ordinary pad configuration to an Area Array (AA) pad configuration where the redistributed AA pads are terminated with a barrier metal (345), which acts as an under-ball metallurgy (UBM) as seen in both FIGS. 3a and 3b. It is preferred that the UBM comprises copper and nickel, and has a thickness between about 1 to 50 micrometers. The adhesive film can be formed on the wafer by either spin coating, screen printing or lamination under pressure, where the latter is preferred.

Openings (360) in adhesive layer (350) reaching barrier metal (345) are next formed by either laser drilling, photolithographic methods, or by silk screening the AA configuration onto the adhesive layer in the first place. It is preferred that laser drilling is employed in this instance. The adwafer so prepared is then diced into Chip Scale Packages, or, CSPs.

Figure 3E:
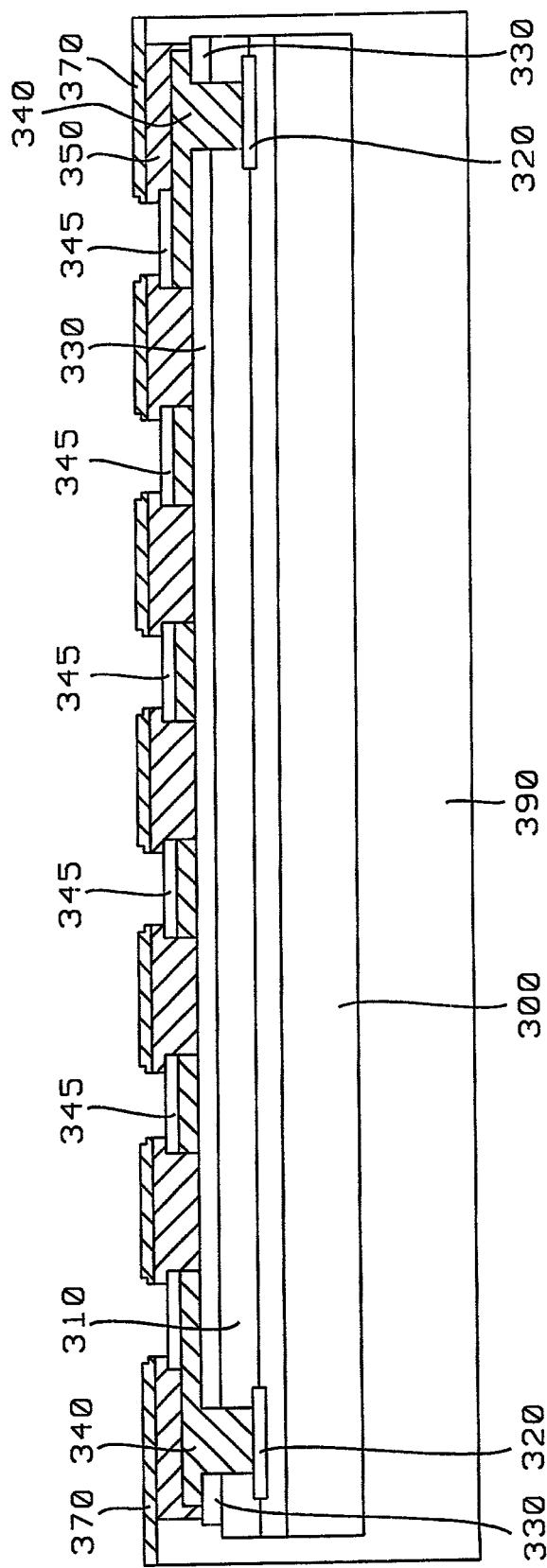
FIG. 3e is a cross-sectional view of a portion of the wafer of FIG. 3d, showing the encapsulation in a molding material, according to the present invention.
Figure 3F:
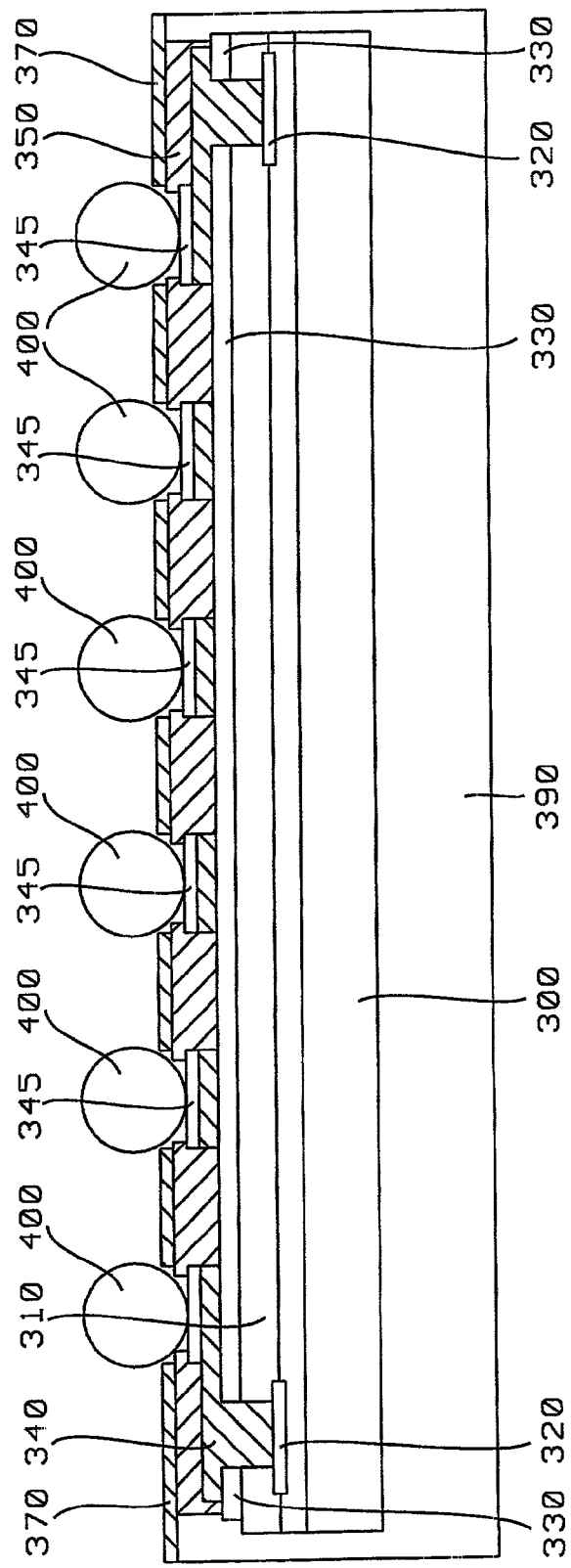
FIG. 3f is a cross-sectional view of a portion of the encapsulated wafer package showing the forming of ball mounts, according to the present invention.

As a key aspect of the second embodiment, a substrate (370), similar to the BGA substrate (150) used in the first embodiment, is next prepared with drilled via openings (380) corresponding to the AA pad array on the CSPs to be attached as shown in FIG. 3c. It is preferred that substrate (370) comprises BT and has a thickness between about 150 to 300 micrometers. Then the CSP of FIG. 3b is die attached to substrate (370), as shown in FIG. 3d. This is accomplished at a pressure between about 1.5 to 2.5 Mpascals and temperature between about 250 to 350.degree. C. The resulting package is next encapsulated with a molding material (390) using a molding process as shown in FIG. 3e. This is followed by another key feature of the second embodiment, namely, a reflow ball mounting process is performed to form a solder (400) over openings (360) and connected to the AA I/O pads of the chip sites within the wafer, as shown in FIG. 3f. This is accomplished by forming solder (400) comprising tin-lead or tin-silver alloy.

Figure 4:
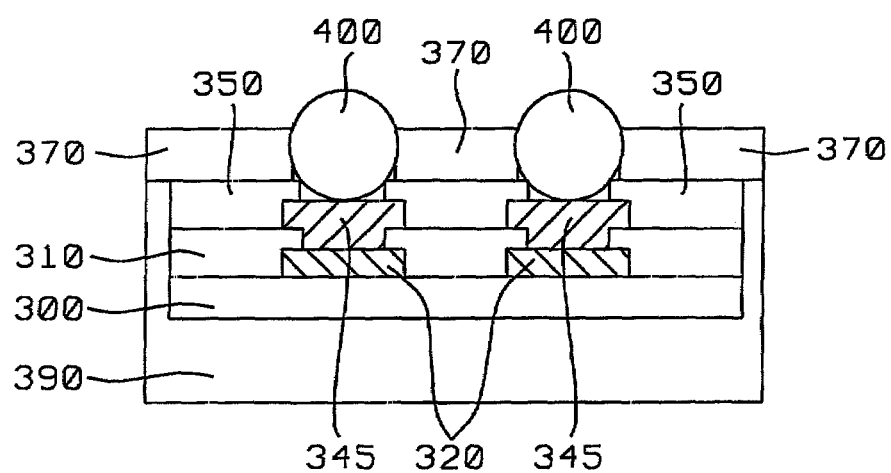
FIG. 4 is a cross-sectional view of a Chip Scale Package (CSP) of the present invention, showing that the invention can perform on a chip designed without the area array pads, and with no distribution layer, according to the present invention.

Though these numerous details of the disclosed method are set forth here, such as process parameters, to provide an understanding of the present invention, it will be obvious, however, to those skilled in the art that these specific details need not be employed to practice the present invention. At the same time, it will be evident that the same methods may be employed in other similar process steps that are too many to cite, such as, for example forming a CSP product without a re-routing metal layer which is replaced by an UBM layer such as shown in FIG. 4.

It will thus be apparent to those skilled in the art that the disclosed invention can improve the performance of the various levels of packaging in computers through the use of solder connections in place of wire bonding. At the same time, the disclosed Chip Scale Packaging (CSP) can improve the testing cost by keeping the same body size of chip using the same size substrate. The conventional CSP's on the other hand, have varying body sizes, and therefore, requiring different test fixtures. Even more varying sizes are expected with shrinking product sizes, especially with memory products, and hence, large over-head expenditures for the well-known back-end testing on the production line. This is not the case with the uniformly formed CSPs of the present invention. The presently disclosed CSP's can also provide improved thermal reliability by encapsulating the chips with molding materials that will reduce the coefficient of thermal expansion (CTE) mismatch between the silicon chip and the next level of packaging. Hence, molding materials other than those described here may also be used without departing from the letter and spirit of the invention.

That is, while the invention has been particularly shown and described with reference to the preferred embodiments thereof, it will be understood by those skilled in the art that various changes in form and details may be made without departing from the spirit and scope of the invention.

What is claimed is:

1. A method of fabricating a chip package, comprising:
    joining a top surface of a substrate and a bottom side of a die, wherein a first opening through said substrate is under said bottom side of said die, wherein said die comprises a first conductive layer, a second conductive layer and a passivation layer at said bottom side of said die, wherein a second opening in said passivation layer is under a first contact point of said first conductive layer, and said first contact point is at a top of said second opening, wherein said second conductive layer is coupled to said first contact point through said second opening, wherein said second conductive layer has a second contact point over said first opening;
    after said joining said top surface of said substrate and said bottom side of said die, forming a conductive interconnect coupled to said second contact point though said first opening; and
    after said joining said top surface of said substrate and said bottom side of said die, forming a molding material on a sidewall of said die and en-over said top surface of said substrate.

2. The method of claim 1, wherein said first conductive layer comprises copper.

3. The method of claim 1, wherein said first conductive layer comprises aluminum.

4. The method of claim 1, wherein said second conductive layer comprises nickel.

5. The method of claim 1, wherein said second conductive layer comprises copper.

6. The method of claim 1, after said forming said conductive interconnect and said forming said molding material, further comprising separating said molding material and said substrate into multiple portions, wherein said separating said molding material and said substrate comprises a sawing process.

7. The method of claim 1, wherein said molding material comprises an epoxy.

8. The method of claim 1 comprising said forming said molding material further over a top side of said die.

9. The method of claim 1, wherein said substrate comprises bismaleimide triazine.

10. A method of fabricating a chip package, comprising:
    forming an adhesive material on a top surface of a substrate;
    after said forming said adhesive material, joining said top surface of said substrate and a bottom side of a die with said adhesive material, wherein a first opening through said substrate is under said bottom side of said die, wherein said die comprises a copper layer, a conductive pad and a passivation layer at said bottom side of said die, wherein a second opening in said passivation layer is under a first contact point of said copper layer, and said first contact point is at a top of said second opening, wherein said conductive pad is coupled to said first contact point through said second opening, wherein said conductive pad has a second contact point over said first opening;
    after said joining said top surface of said substrate and said bottom side of said die, forming a conductive interconnect coupled to said second contact point through said first opening;
    after said joining said top surface of said substrate and said bottom side of said die, forming a molding material on a sidewall of said die and over said top surface of said substrate; and
    after said forming said conductive interconnect and said forming said molding material, separating said molding material and said substrate into multiple portions, wherein said separating said molding material and said substrate comprises a sawing process.

11. The method of claim 10, wherein said conductive pad comprises nickel.

12. The method of claim 10, wherein said conductive pad comprises copper.

13. The method of claim 10, wherein said molding material comprises an epoxy.

14. The method of claim 10 comprising said forming said molding material further over a top side of said die.

15. The method of claim 10, wherein said substrate comprises bismaleimide triazine (BT).

16. A method of fabricating a chip package, comprising:
forming an adhesive material on a top surface of a substrate;
after said forming said adhesive material, joining said top surface of said substrate and a bottom side of a die with said adhesive material, wherein an opening through said substrate is under said bottom side of said die, wherein said die comprises a copper layer and a conductive pad at said bottom side of said die, wherein said conductive pad is coupled upwards to a bottom surface of said copper layer, wherein said conductive pad has a contact point over said opening;
after said joining said top surface of said substrate and said bottom side of said die, forming a conductive interconnect coupled to said contact point through said opening; and
after said joining said top surface of said substrate and said bottom side of said die, forming a molding material on a sidewall of said die and over said top surface of said substrate.

17. The method of claim 16, wherein said conductive pad comprises nickel.

18. The method of claim 16, wherein said conductive pad comprises copper.

19. The method of claim 16, wherein said molding material comprises an epoxy.

20. The method of claim 16 comprising said forming said molding material further over a top side of said die.

21. The method of claim 16, after said forming said conductive interconnect and said forming said molding material, further comprising separating said molding material and said substrate into multiple portions, wherein said separating said molding material and said substrate comprises a sawing process.

22. The method of claim 16, wherein said substrate comprises bismaleimide triazine.

23. A method of fabricating a chip package, comprising:
forming a molding material on a sidewall of a die and on a top side of said die, wherein said die comprises a conductive pad at a bottom side of said die and a passivation layer at said bottom side of said die, wherein an opening in said passivation layer is under a contact point of said conductive pad, and said contact point is at a top of said opening, wherein all of said passivation layer is vertically under an upper portion of said die, wherein said conductive pad comprises a copper layer;
after said forming said molding material, forming a conductive interconnect coupled to said conductive pad; and
after said forming said conductive interconnect, separating said molding material into multiple portions, wherein said separating said molding material comprises a sawing process.

24. The method of claim 23, wherein said molding material comprises an epoxy.

25. A method of fabricating a chip package, comprising:
joining a substrate and a die;
after said joining said substrate and said die, forming a molding material over said substrate and said die; and
after said forming said molding material, performing a sawing process to provide said chip package comprising a part of said substrate, said die over a top surface of said part of said substrate, a conductive bump having first portion located in an opening in said substrate and a second portion contacting said die, and a part of said molding material over said top surface and said die and at left and right sides of said die, wherein said part of said molding material has a left edge and a right edge substantially parallel with said left edge of said part of said molding material, wherein said part of said molding material comprises a first portion vertically over a left edge of said die, a second portion vertically over a right edge of said die and a third portion vertically over said die and between said first and second portions, wherein said first, second and third portions continuously extend over said die.

26. The method of claim 25, wherein said part of said substrate in said chip package comprises a ball-grid-array (BGA) substrate.

27. The method of claim 25, wherein said part of said substrate in said chip package has a left edge substantially aligned with said left edge of said part of said molding material and a right edge substantially aligned with said right edge of said part of said molding material.

28. The method of claim 25, wherein said die in said chip package comprises a copper pad at a bottom side of said die and vertically over said conductive bump.

29. The method of claim 25, wherein said die in said chip package comprises an aluminum-containing pad at a bottom side of said die and vertically over said conductive bump.

30. The method of claim 25, wherein said die in said chip package comprises a contact pad at a bottom side of said die, a passivation layer at said bottom side of said die, wherein an opening in said passivation layer is under a contact point of said contact pad, and said contact point is at a top of said opening, and a conductive layer at said bottom side of said die and under said passivation layer and said contact point, wherein said conductive layer is coupled to said contact point through said opening, wherein said conductive bump in said chip package is under said conductive layer.

31. The method of claim 30, wherein said conductive layer of said die in said chip package comprises copper.

32. The method of claim 30, wherein said conductive layer of said die in said chip package comprises nickel.

33. The method of claim 30, wherein said contact pad of said die in said chip package comprises copper.

34. The method of claim 30, wherein said contact pad of said die in said chip package comprises aluminum.

35. The method of claim 25, wherein said conductive bump in said chip package comprises tin.

36. The method of claim 25, wherein said conductive bump in said chip package comprises a tin-lead alloy.

37. The method of claim 25, wherein said conductive bump in said chip package comprises a tin-silver alloy.

38. The method of claim 25, wherein said conductive bump in said chip package comprises a solder ball.

39. The method of claim 25, wherein said part of said substrate in said chip package comprises bismaleimide triazine.

40. A method of fabricating a chip package, comprising:
joining a first substrate and a second substrate, wherein a first opening in said first substrate exposes a bottom side of said second substrate, wherein said second substrate comprises a copper pad and a separating layer at said bottom side of said second substrate, wherein a second opening in said separating layer is under a contact point of said copper pad, and said contact point is at a top of said second opening;

after said joining said first substrate and said second substrate, forming a conductive bump under said second substrate, the conductive bump having a first portion in said first opening, and a second portion conductive that is coupled to said contact point through said second opening; and after said forming said conductive bump, performing a sawing process.

41. The method of claim 40, wherein said second substrate further comprises a conductive layer at said bottom side of said second substrate and under said separating layer and said contact point, wherein said conductive layer is coupled to said contact point through said second opening, wherein said first opening is under said conductive layer.

42. The method of claim 41, wherein said conductive layer comprises copper.

43. The method of claim 41, wherein said conductive layer comprises nickel.

44. The method of claim 40, wherein said first opening is vertically under said contact point.

45. The method of claim 40, wherein said conductive bump contacts a sidewall of said first opening.

46. The method of claim 40, wherein said second substrate comprises a die.

47. The method of claim 40 further comprising said joining said first substrate and said second substrate using an adhesive material.

48. A method of fabricating a chip package, comprising:
joining a first substrate and a second substrate comprising a die sawed from a wafer, wherein a first opening in said first substrate exposes a bottom side of said second substrate, wherein said second substrate comprises a contact pad and a separating layer at said bottom side of said second substrate, wherein a second opening in said separating layer is under a contact point of said contact pad, and said contact point is at a top of said second opening;

after said joining said first substrate and said second substrate, forming a conductive bump-under said second substrate, the conductive bump having a first portion in said first opening conductive that contacts a sidewall of said first opening, and a second portion conductive that is coupled to said contact point through said second opening; and after said forming said conductive bump, performing a sawing process.

49. The method of claim 48, wherein said contact pad comprises a copper pad.

50. The method of claim 48, wherein said contact pad comprises aluminum.

51. The method of claim 48, wherein said second substrate further comprises a conductive layer at said bottom side of said second substrate and under said separating layer and said contact point, wherein said conductive layer is coupled to said contact point through said second opening, wherein said first opening is under said conductive layer.

52. The method of claim 51, wherein said conductive layer comprises copper.

53. The method of claim 51, wherein said metal conductive layer comprises nickel.

54. The method of claim 48, wherein said first opening is vertically under said contact point.

55. The method of claim 48 further comprising said joining said first substrate and said second substrate using an adhesive material.

* * * * *